United States Patent [19]

Kato

[11] Patent Number: 5,610,799
[45] Date of Patent: Mar. 11, 1997

[54] POWER MODULE DEVICE

[75] Inventor: Hazime Kato, Itami, Japan

[73] Assignee: Mitsubishi Denki Kabushiki Kaisha, Tokyo, Japan

[21] Appl. No.: 424,003

[22] Filed: Apr. 18, 1995

[30] Foreign Application Priority Data

Apr. 21, 1994 [JP] Japan .................................. 6-083485

[51] Int. Cl.$^6$ ...................................................... H05K 5/00
[52] U.S. Cl. ........................... 361/752; 361/796; 174/252
[58] Field of Search ..................................... 361/752, 796, 361/761, 784; 257/713, 701, 687; 174/16.3, 252

[56] References Cited

U.S. PATENT DOCUMENTS 5,513,072 4/1996 Imaji et al. ............................ 361/707
5,521,437 5/1996 Oshima et al. ........................ 257/701
5,536,972 7/1996 Kato ....................................... 257/706

FOREIGN PATENT DOCUMENTS 3104296 4/1991 Japan .
3292768 7/1991 Japan .

Primary Examiner—Leo P. Picard
Assistant Examiner—Y. Whang
Attorney, Agent, or Firm—Leydig, Voit & Mayer

[57] ABSTRACT

The power module device is equipped with a metallic substrate composed of a flat section and a recessed section, and a circuit board which is rested over the recessed section of the metallic substrate. The metallic substrate and the circuit board constitute a package. In the recessed section, the power element is mounted on the bottom surface section and the control element is mounted on the bottom surface of the circuit board. Then, the power element and the control element are electrically connected via a wiring pattern or the like provided on the metallic substrate.

6 Claims, 7 Drawing Sheets

POWER MODULE DEVICE

BACKGROUND OF THE INVENTION

1. Field of the Invention

The present invention relates to a power module device and, more particularly, to a power module device which combines a power element such as a MOSFET, and a control element therefor into one piece.

2. Description of the Related Art

Figure 11:
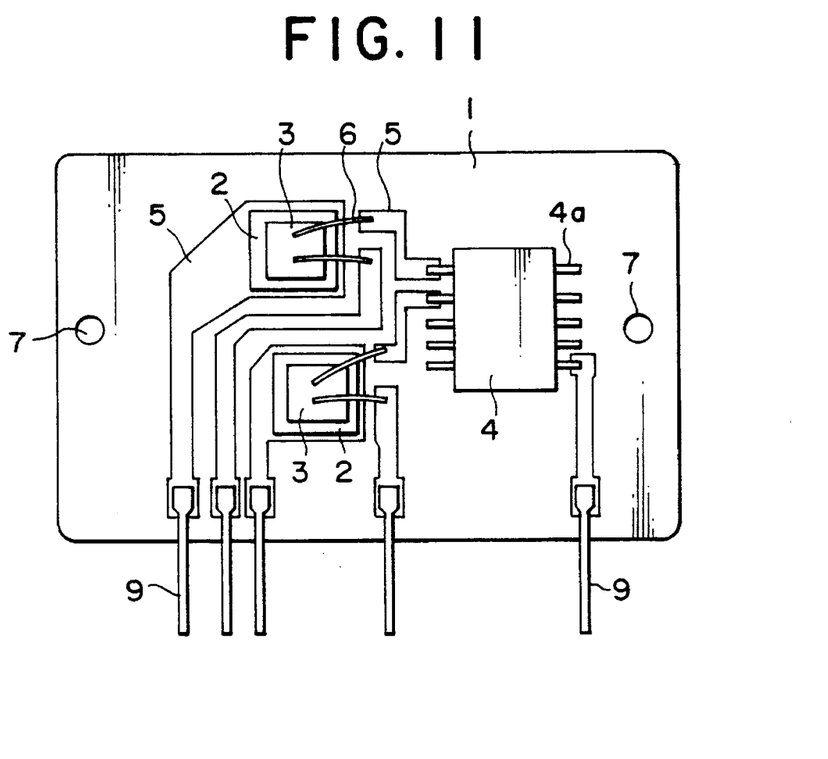
FIG. 11 is a top view of a privately known but unpublished power module device with an armor removed.
Figure 12:
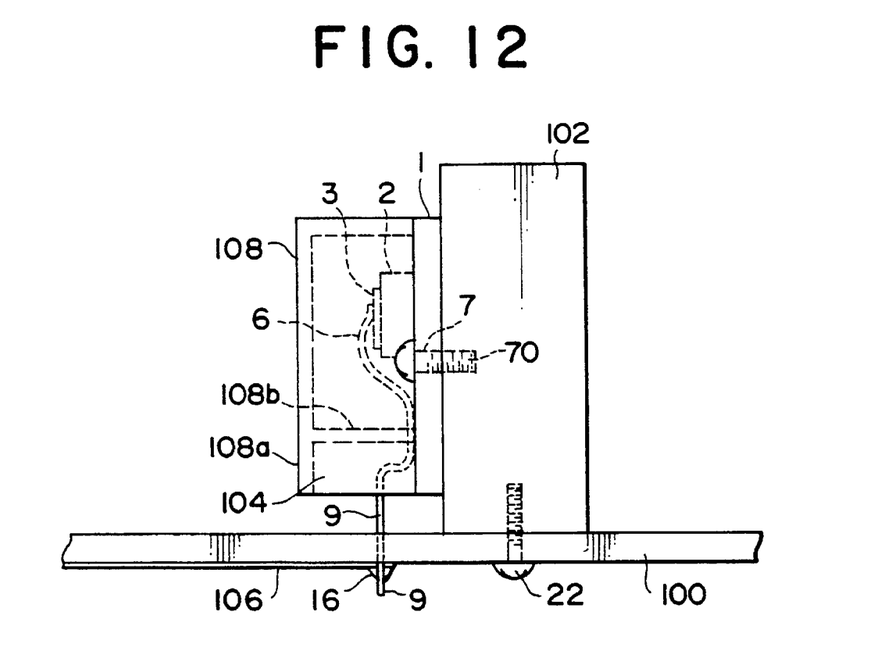
FIG. 12 is a side view of the privately known but unpublished power module device of FIG. 11 which has been mounted.
Figure 13:
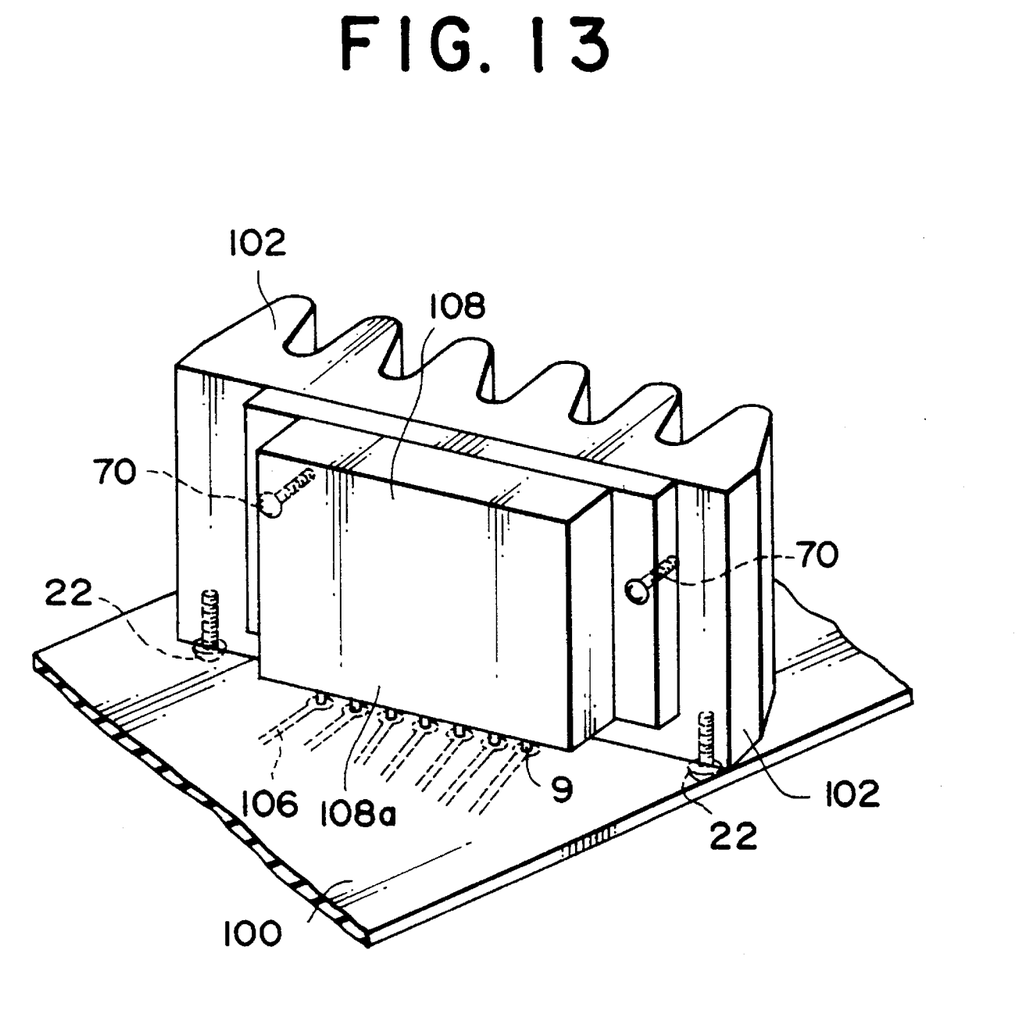
FIG. 13 is a perspective view of FIG. 12.

FIG. 11 is a top view of a known power module device with the exterior cover removed. FIG. 12 and FIG. 13 are a side view and a perspective view, respectively, of the power module device of FIG. 11 which has been mounted so as to be used practically. As shown in FIG. 11, the whole surface of a metallic substrate 1 is covered with an insulating resin layer (not shown) made of epoxy resin or the like, and wiring patterns 5 are provided on the insulating resin layer. Provided on the wiring patterns 5 are a heat sink 2 on which a MOSFET 3 constituting a power element is mounted. The MOSFET 3 is electrically connected to the wiring pattern 5 on the metallic substrate 1 through a bonding wire 6 or the like made of a fine metallic wire as illustrated. Mounted on the metallic substrate 1 is a control element 4 for controlling the MOSFET 3, the control element 4 being electrically connected to the MOSFET 3 through the wiring pattern 5 and the bonding wire 6. The MOSFET 3, the heat sink 2, etc. are covered with gel-like resin (not illustrated) to protect them against humidity. A relatively viscous gel-like resin is suitable for this purpose so that it does not spread too much because it is only locally used for the MOSFET 3 on the metallic substrate 1. Further, since lead wires 9, which are electrically connected to the wiring patterns 5 on the metallic substrate 1, are connected to electrodes 106 (see FIG. 12), etc. provided on a printed circuit board 100 (see FIG. 12) at the time of mounting; therefore, the lead wires 9 are provided so that it extends outward in a cantilever-manner. The metallic substrate 1 is mounted on a radiator 102 (see FIG. 12) such as a heat sink and therefore the metallic substrate 1 is provided with a plurality of mounting holes 7 for installing it on the radiator 102.

In the case of the known power module device having the structure described above, as illustrated in FIG. 12 and FIG. 13, a box-shaped cover 108 made of resin is provided on the metallic substrate 1 for mechanically protecting the MOSFET 3 and other mounted components including the control element 4 at the time of packaging. The box-shaped cover 108 is installed in such a manner that only both ends of the metallic substrate 1, where the mounting holes 7 of the metallic substrate 1 are provided, are exposed. The metallic substrate 1 is attached to the radiator 102, such as a heat sink, by screws 70 installed through the mounting holes 7. The radiator 102 is attached on the printed circuit board 100, such as a glass-epoxy substrate, by screws 22 as illustrated. Furthermore, a partitioning plate 108b is provided within the box-shaped cover 108 as illustrated in FIG. 12 to mechanically protect the lead wires 9 which extend in a cantilever-manner. The wirings 5 extend under the partitioning plate 108b (see FIG. 11) and ends thereof are soldered to the lead wires 9. The lead wires 9 extend in parallel to the metallic substrate 1, pass through the printed circuit board 100, and are electrically connected, with solder 16, to for example the electrodes 106 mounted on the printed circuit board 100. For the purpose of reinforcing the lead wires 9, the space which is enclosed by the box-shaped cover 108, the partitioning plate 108b, and the metallic substrate 1, is filled with resin 104.

As stated above, the known power module device has the MOSFET 3 and the control element 4 which are mounted two-dimensionally on the single metallic substrate 1. Further, the conductor constituting the wiring pattern 5 needs to be relatively thick because a relatively large current must be supplied to the wiring pattern 5, this results because it is difficult to provide the wiring pattern 5 with a high-density wiring. For these reasons, the known metallic substrate 1 has a problem in that it needs to be made large for the wiring and therefore it is extremely difficult to make the device smaller.

In addition, there are problems related to the lead wires. The lead wires 9, which extend outward in a cantilever manner, require the box-shaped cover 108 and the resin 104 or the like filled in the box-shaped cover 108 to provide the lead wires 9 with a mechanical protection. Further, protection of the components including the MOSFET 3 and the wiring pattern 5 mounted on the metallic substrate 1 from mechanical damage requires the provision of the box-shaped cover 108 made of resin or the like to cover the surface of the metallic substrate 1. Therefore, numerous assembly steps are required, resulting in a high cost production.

There is still another problem with the conventional power module device namely, the heat generated by the MOSFET 3 constituting the power element is transmitted to the whole metallic substrate 1 through the heat sink 2, and the control element 4 is unavoidably subjected to the heat, causing the control element 4 to malfunction.

SUMMARY OF THE INVENTION

The present invention has been made with a view toward solving the problems described above and it is therefore an object of the present invention to provide a power module device which permits a simplified assembly process, reduced cost, and a smaller size and which is also capable of preventing the heat generated by a power element from being transmitted to a control element.

To this end, in a preferred form of the invention, a power module device is equipped with a metallic substrate constituted by a recessed portion, which houses a power element, and a flat portion which extends outward from the recessed portion, a circuit board which is fixed onto the metallic substrate in a manner that it covers the recessed portion and which has a control element mounted on a surface facing against the bottom surface of the recessed portion, and an electrical connection means for providing the electrical interconnection between the power element and the control element and for the electrical connection with an outside system, the metallic substrate and the circuit board constituting a package.

With this arrangement, the size of the metallic substrate can be reduced with a consequent reduced size of the entire power module device and the assembly process can be therefore simplified since the power element is mounted in the recessed portion provided in the metallic substrate and the circuit board with the control element mounted on the bottom surface thereof is placed over the recessed portion. Further, since the power element and the control element are mounted in the recessed portion provided in the metallic substrate, they can be protected against mechanical damage without the need for providing a special armor. Moreover, the wiring conductor provided on the metallic substrate and the circuit board can be mechanically and electrically connected when placing the circuit board over the recessed portion, thus permitting easier connection between the metallic substrate and the circuit board. Further, it is possible to prevent the heat produced by the power element from being transmitted to the control element.

In another preferred form of the invention, the recessed portion of the metallic substrate has a bottom surface section and a side wall section which extends continuously from the bottom surface section.

With this arrangement, since the side wall section of the recessed portion is provided continuously, it is possible to securely protect the mounted components including the power element and control element and the wiring conductor, etc. from mechanical damage. Further, as necessary, the side wall section, which is continuously provided, allows resin for protecting the power element from humidity to be charged easily in the recessed portion without causing the resin to spread.

In a further preferred form of the invention, the recessed portion of the metallic substrate has a bottom surface section and a pair of opposing side wall sections which extend upward from the opposing sides of the bottom surface section.

With this arrangement, the size of the metallic substrate can be further reduced since the recessed portion has only one pair of opposing side walls.

In a still further preferred form of the invention, the metallic substrate has a bent portion which functions as a connector.

With this arrangement, since the metallic substrate is equipped with a bent section which serves as a connector, there is no longer the need for providing a separate connector on the metallic substrate, thus permitting a further reduced size of the substrate, a simplified assembly, and reduced cost.

DESCRIPTION OF THE PREFERRED EMBODIMENTS

First Embodiment

Figure 1:
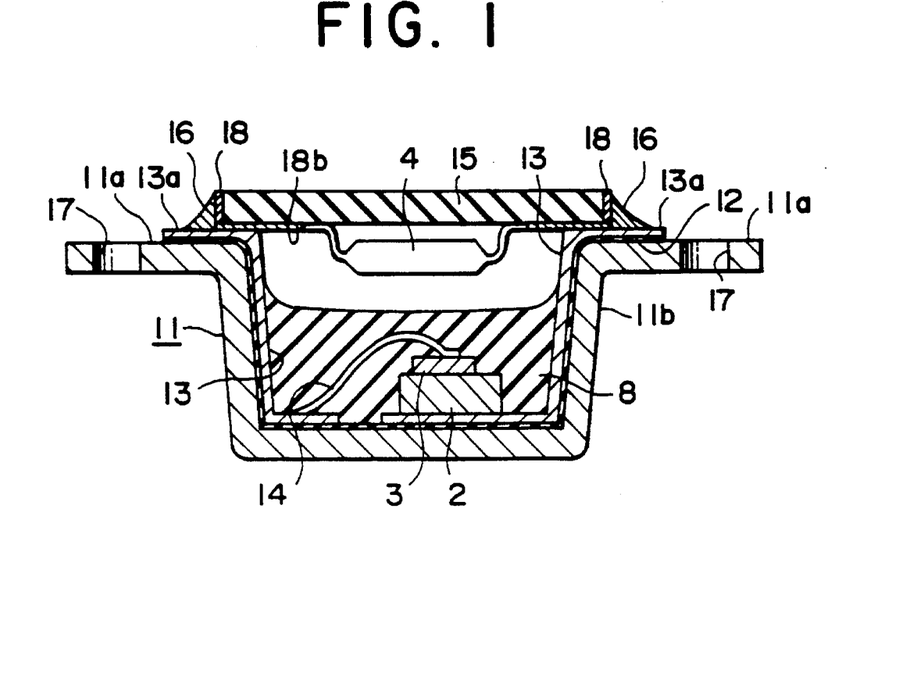
FIG. 1 is a cross-sectional view of a power module device according to a first embodiment of the present invention.
Figure 2:
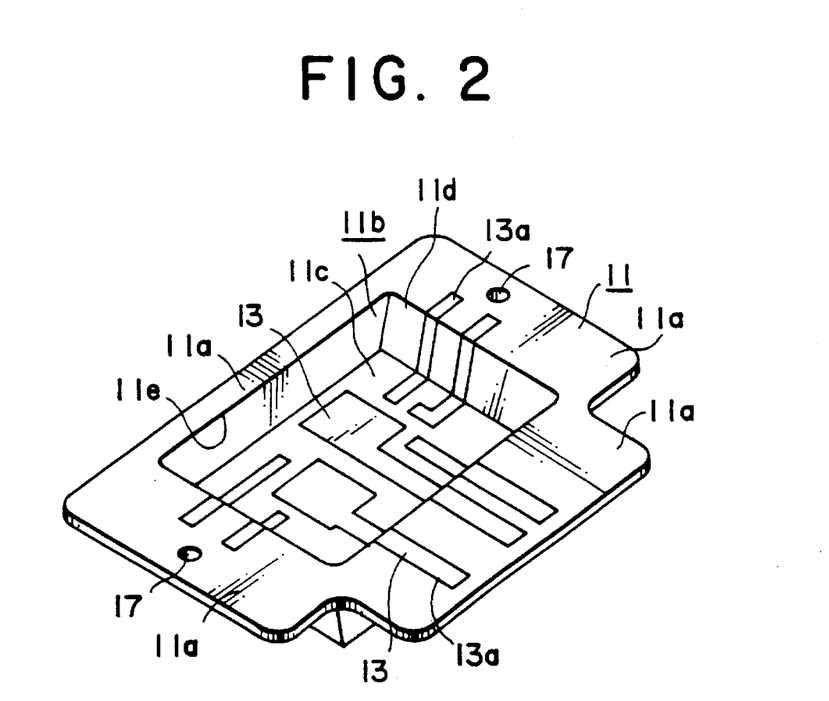
FIG. 2 is a perspective view of a metallic substrate of the first embodiment.

The following describes the embodiments of the present invention in conjunction with the accompanying drawings. FIG. 1 is the cross-sectional view illustrating the power module device according to the first embodiment. FIG. 2 is the perspective view illustrating the metallic substrate shown in FIG. 1. As shown in FIG. 1 and FIG. 2, a metallic substrate 11 has a flat section 11a and a box-shaped recessed section 11b which is formed by drawing or the like to provide a predetermined depth from the flat section 11a and which has an opening 11e. The recessed section 11b has a bottom surface section 11c and a side wall 11d which continuously extends upward from the circumference of the bottom surface section 11c. The side wall 11d may be provided with a predetermined slope as illustrated in FIG. 1 or it may be provided substantially perpendicularly to the bottom surface section 11c. The opening 11e of the recessed section 11b opens upward as illustrated and the flat section 11a is provided in such a manner that it extends, from the opening 11e of the recessed section 11b, outward horizontally to be nearly parallel to the bottom surface section 11c. The flat section 11a of the metallic substrate 11 may be provided as a pair on both sides as in the case of the embodiment shown in FIG. 5 to be discussed later, or it may be provided in four directions as shown in FIG. 2, or it may be provided in three directions.

Provided on the surface of the metallic substrate 11 is an insulating resin layer 12 as shown in FIG. 1, and provided on the insulating resin layer 12 are wiring patterns 13 comprised of a conductor such as copper. A heat-resistant resin such as polyimide which has flexibility to permit easy bending is suitably used for the insulating resin layer 12. As illustrated, the wiring patterns 13 are formed, beginning from the bottom surface section 11c of the recessed section 11b of the metallic substrate 11 up to the flat section 11a of the metallic substrate 11 along the side wall 11d of the recessed section 11b. The wiring patterns 13 should be made as thin as possible, provided it is strong enough to survive the forming step of the recessed section 11b and also survive the operating currant to which it will be subjected because the wiring patterns 13 are produced before the recessed section 11b of the metallic substrate 11 is formed by drawing or the like.

A first heat sink 2 is provided on the wiring patterns 13 which are mounted on the bottom surface section 11c of the recessed section 11b of the metallic substrate 11. The MOSFET 3, which is the power element, is fixed onto the first heat sink 2 with solder or the like. The MOSFET 3 is electrically connected to the wiring patterns 13 through fine metallic wires 14 such as a bonding wire. Input/output terminals 13a of the MOSFET 3 are formed integrally with the wiring patterns 13 on the end of the flat section 11a of the metallic substrate 11 of the wiring patterns 13, the MOSFET 3 being electrically connected to the input/output terminals 13a through the fine metallic wirings 14 and the wiring patterns 13. The input/output terminals 13a may not be formed integrally with the wiring pattern 13; it may alternatively be made in a discrete form and then electrically connected to the wiring pattern 13. The recessed section 11b is filled with a predetermined amount of resin 8 such as silicone resin to fully seal the MOSFET 3 to protect the MOSFET 3 from humidity. The resin 8 to be used for this purpose should be a resin which is close to a liquid and which has a relatively low viscosity for less bubbles produced inside. Thus, filling the recessed section 11b with the resin 8 protects the MOSFET 3 from humidity and also prevents a short circuit between the wires of the wiring pattern 13 or other similar component due to humidity or the like, enabling the protection of the insulation between the wires.

Figure 3:
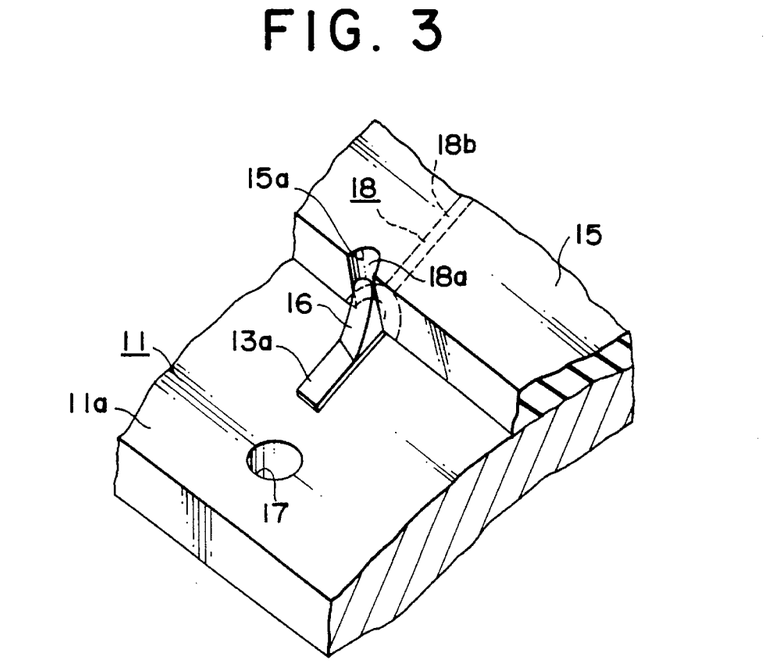
FIG. 3 is a partial perspective view of the junction or connecting portion between a circuit board and the metallic substrate according to the first embodiment of the present invention.

Furthermore, in the power module device according to the present invention, as shown in FIG. 1, the circuit board 15, composed of the glass-epoxy substrate or the like, bridges the flat sections 11a over the recessed section 11b in such a manner that it covers the recessed section 11b of the metallic substrate 11. Hence, in the power module device according to the present invention, the metallic substrate 11 and the circuit board 15 constitute the package of the power module device. Electrodes 18 are provided on ends of the circuit board 15 and the electrodes 18 are electrically and mechanically connected, with the solder 16, to the input/output terminals 13a of the MOSFET 3 provided on the flat section 11a of the metallic substrate 11. FIG. 3 is the perspective view of the electrode 18 which has been connected to the input/output terminal 13a. As illustrated in FIG. 3, the electrode 18 is constituted by an electrode main body 18b mounted on the bottom surface of the circuit board 15 and a connecting surface 18a which is provided on the end of the circuit board 15 which electrically connected to the electrode main body 18b. The connecting surface 18a can be formed for example by first providing a notch 15a in the end of the circuit board 15, then providing the surface of the exposed surface of the notch 15a with an appropriate conductor by plating or the like. The circuit board 15 is positioned so as to couple the connecting surface 18a of the electrode 18 thus configured to the input/output terminal 13a of the MOSFET 3, and it is mounted on the flat sections 11a of the metallic substrate 11. The connecting surface 18a of the electrode 18 is then electrically and mechanically connected with the solder 6 to the input/output terminal 13a of the MOSFET 3 as mentioned above. Thus, the wiring pattern 13 and the input/output terminal 13a provided on the metallic substrate 11, the electrode 18 provided on the circuit board 15, and the solder 16 which connects between the input/output terminal 13a and the electrode 18, constitutes an electrical connection means for providing the electrical interconnection between the MOSFET 3 and the control element 4 to be discussed later and also the electrical connection with an external system. This embodiment shows an example wherein the electrode main body 18b is mounted on the bottom surface of the circuit board 15; it is not, however limited thereto. The electrode main body 18b may alternatively be provided on the top surface of the circuit board 15. In such a case, the electrical connection with the control element 4 may be accomplished by providing the circuit board 15 with a through hole (not illustrated).

Furthermore, in the power module device according to the present invention, as shown in FIG. 1, the molded control element 4 is mounted to the bottom surface of the circuit board 15, the control element 4 being spaced away from the MOSFET 3 in the recessed section 11b of the metallic substrate 11. As illustrated, the control element 4 must be provided in such a manner that it does not touch the aforesaid resin 8 charged in the recessed section 11b. For this reason, only a predetermined amount of the aforesaid resin 8 is charged so that the area where the control element 4 is mounted is left in the recessed section 11b. The control element 4 is electrically connected to the MOSFET 3 through the electrode 18 provided on the circuit board 15 and the wiring pattern 13 or the like on the metallic substrate 11. The flat section 11b of the metallic substrate 11 is provided with a plurality of mounting holes 17 as illustrated, and the power module device is installed with screws through the mounting holes 17.

Figure 4:
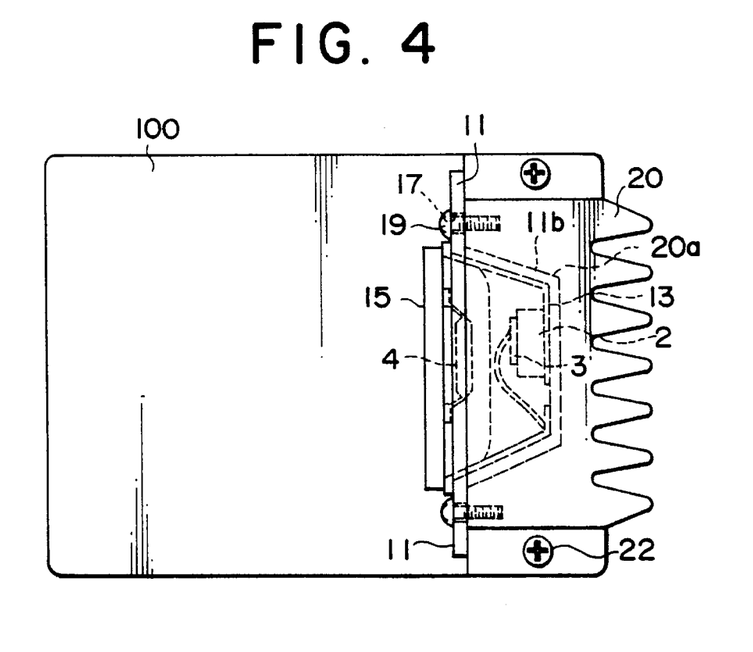
FIG. 4 is a front view of an example of the power module device of the first embodiment which has been mounted.

The following describes the mounting method for the power module device in this embodiment. As shown in FIG. 4, a recessed device mounting section 20a, which has a complementary shape with respect to the external shape of the recessed section 11b of the metallic substrate 11, is provided on a radiator 20 such as a heat sink, then the recessed section 11b of the metallic substrate 11 is fitted in the device mounting section 20a. In the next step, the metallic substrate 11 is installed onto the radiator 20 with the screws 19 through the mounting holes 17 provided in the flat section 11b of the metallic substrate 11. As necessary, a printed circuit 100 composed of a glass-epoxy board may be prepared and the radiator 20 with the power module device mounted on may be screwed onto the printed circuit board 100 with screws 22. Thus, the power module device according to the present invention is fitted in and housed in the device mounting section 20a of the radiator 20 at the time of mounting; therefore, it is protected by the radiator 20 from external mechanical damage.

In the power module device in this embodiment thus constructed, the MOSFET 3, i.e. the power element, is mounted in the recessed section 11b formed on the metallic substrate 11 and the circuit board 15 with the control element 4 mounted thereon is rested over the recessed section 11b. This makes it possible to considerably reduce the size of the finished power module device in comparison with the known power module device which has the MOSFET 3 and the control element 4 mounted on the same board at the same level. Moreover, in the known power module device, the wiring is provided in a two-dimensional manner on the same board on which the MOSFET 3 and the control-element 4 are mounted, so that an area for the wiring must be provided, leading to the need of a significantly large board. In the power module device according to this embodiment, the control element 4 is mounted on a separate circuit board 15 and the wiring is provided in a three-dimensional manner on the bottom surface section 11c and the side wall 11d of the recessed section 11b of the metallic substrate 11 and on the flat section 11a of the metallic substrate 11, thereby laying out the metallic substrate 11 and the circuit board 15 in a three-dimensional manner. This permits a substantially smaller bottom area of the device. Furthermore, the three-dimensional wiring eliminates the need for curving the wires to bypass other wiring as in the case of the known device illustrated in FIG. 11. This linear wiring allows the wiring pattern 13 to be shorter.

Further, the known power module inevitably ends up with a great total height since the resinous box-shaped cover 108, which is made relatively thick for the mechanical protection of the components mounted on the metallic substrate 1, is provided on the metallic substrate 1. In the power module device according to this embodiment, the metallic substrate 11, which is thinner than the known resinous box-shaped cover 108, serves as the board and also as the package, thereby allowing the overall height of the device to be reduced.

According to the embodiment, the input/output terminal 13a of the MOSFET 3 is provided on the flat section 11a of the metallic substrate 11 and the electrode 18 of the circuit board 15 mounted on the flat section 11a is provided along the surface of the circuit board 15 to correspond to the input/output terminal 13a and the input/output terminal 13a of the MOSFET 3 and the electrode 18 are electrically and mechanically connected with the solder 16 when installing the circuit board 15. This method eliminates the need for the lead wire 9 employed in the known power module device and enables a simpler connecting process. In addition, the embodiment no longer requires the protecting means such as the box-shaped cover 108 and the resin 104 charged in the box-shaped cover 108 for protecting the lead wire 9 shown in the known device.

The arrangement, where the metallic substrate 11 is provided with the recessed section 11b and the wiring pattern 13, the MOSFET 3, and the control element 4 are mounted in the recessed section 11b, enables easier mechanical protection of the wiring pattern 13, the MOSFET 3, etc. from mechanical damage and eliminates the need of the special protection such as the box-shaped cover 108 for protecting the wiring pattern 13, the MOSFET 3, etc. from mechanical damage, thus achieving a further simplified assembly process and lower cost.

Still further, in this embodiment, the MOSFET 3 which generates heat, is installed on the metallic substrate 11 and the control element 4 is mounted on the circuit board 15. This design prevents the heat produced by the MOSFET 3 from being transferred to the control element 4 via the metallic substrate 11, thereby preventing the control element 4 from malfunctioning due to the heat.

Furthermore, in this embodiment, since the MOSFET 3 and the control element 4 are mounted on separate boards before they are assembled, it is possible to subject the MOSFET 3 and the control element 4 separately to reliability testing.

Second Embodiment

Figure 5:
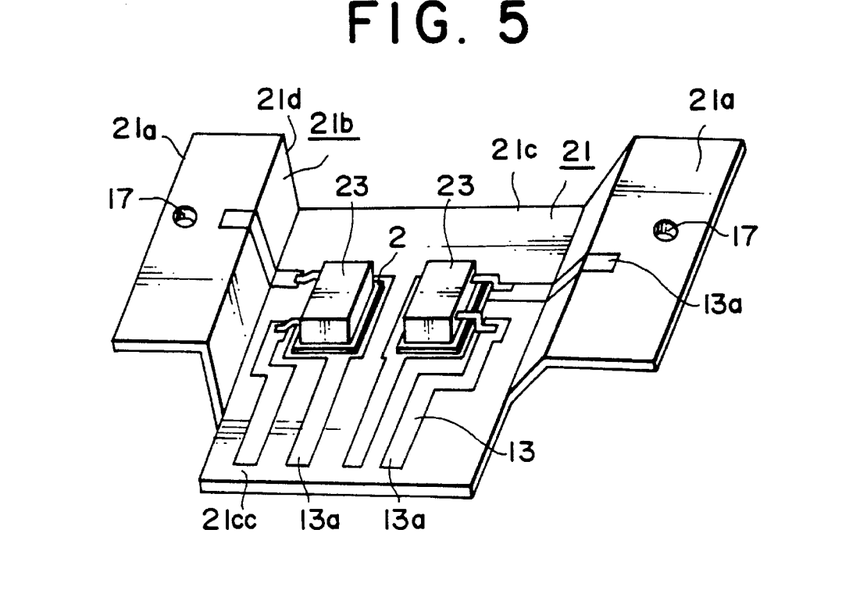
FIG. 5 is a perspective view of the metallic substrate of the power module device according to a second embodiment of the present invention.

FIG. 5 is the perspective view illustrative of the metallic substrate of the power module device according to the present invention in another embodiment of the invention. The description of the part of the structure which is identical to that of the first embodiment will be omitted. The second embodiment refers to the case where a pre-packaged MOSFET 23 is employed. As illustrated in FIG. 5, a metallic substrate 21 is composed of a recessed section 21b and a pair of flat sections 21a which extend horizontally outward from both ends of the opening in the recessed section 21b. The recessed section 21b is composed of a bottom surface section 21c which is provided nearly in parallel to the flat section 21a and a side wall 21d which extends upward nearly vertically or with a predetermined slope up to the flat section 21a from the two opposing sides of the bottom surface section 21c. The metallic substrate 21 can be formed by bending both ends of a nearly rectangular metal plate into a reversed-L shape by, for example, pressing or the like by using a metal mold or the like.

As in the first embodiment, the second embodiment also has the wiring pattern 13 provided along the bottom surface section 21c, the side wall 21d, and the flat section 21a of the metallic substrate 21. Formed on the end of the flat section 21a of the wiring pattern 13 is the input/output terminal 13a of the MOSFET 23 which is made integral with the wiring pattern 13. In the bottom surface section 21c of the metallic substrate 21, an end 21cc of the bottom surface section 21c, on which the side wall 21d is not provided, extends outward with respect to the side wall 21d, the input/output terminal 13a being provided on the end 21cc as an integral part of the wiring pattern 13. In the bottom surface section 21c, the heat sink 2 is provided on the wiring pattern 13 and the MOSFET 23 is mounted on the heat sink 2. In this second embodiment, the MOSFET 23 is packaged in advance and an appropriate known method can be employed for the packaging. Molding with resin or the like, for example, may be employed, or the mounted components may be housed in a package case made of resin or metal or the like.

As in the first embodiment, the power module device according to the second embodiment is constructed by resting the circuit board 15, which has the control element 4 mounted on the bottom surface thereof (see FIG. 1), on the flat sections 21a of the metallic substrate 21. The second embodiment uses the packaged MOSFET 23 and therefore it does not require the resin 8 (see FIG. 1), which protects the MOSFET 3 from humidity as shown in the first embodiment, be charged in the recessed section 21 of the metallic substrate 21. Hence, just providing the recessed section 21b with a pair of opposing side walls 21d is adequate, eliminating the need for the box shape with two pairs of opposing side walls as in the first embodiment. The second embodiment provides the same advantages as those of the first embodiment and it makes it possible to make the metallic substrate 21 even smaller than that in the first embodiment.

Further, the second embodiment refers to the case where the packaged MOSFET 23 is employed. The present invention, however, is not limited thereto; an unpackaged MOSFET 3 (see FIG. 1) as in the first embodiment may alternatively be used. When such an unpackaged MOSFET is used, resin, which is relatively viscous, may be used to protect the MOSFET 3 against humidity as in the known device.

Third Embodiment

Figure 6:
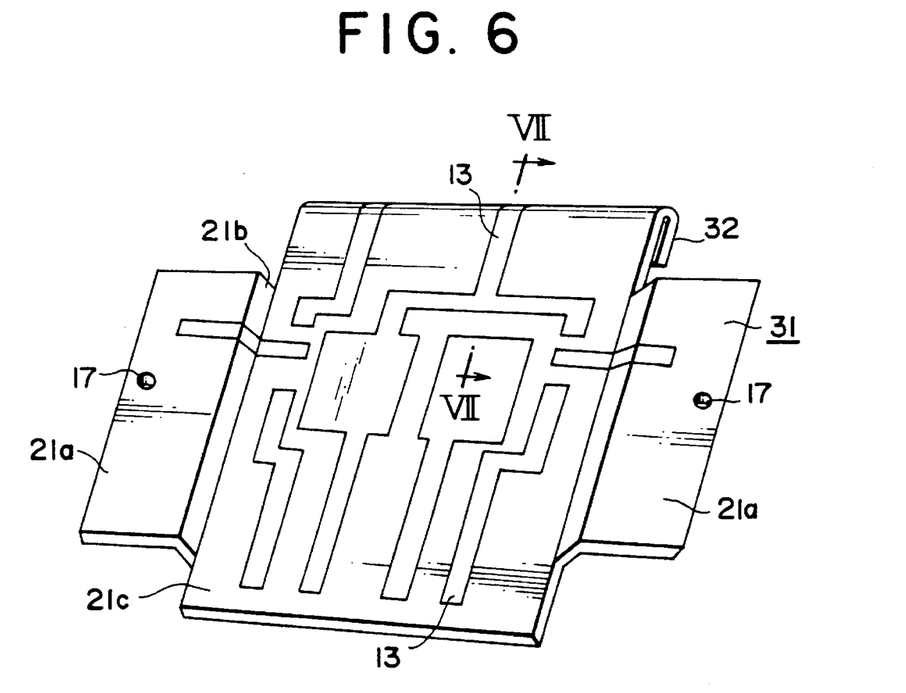
FIG. 6 is a perspective view of the metallic substrate of the power module device according to a third embodiment of the present invention.
Figure 7:
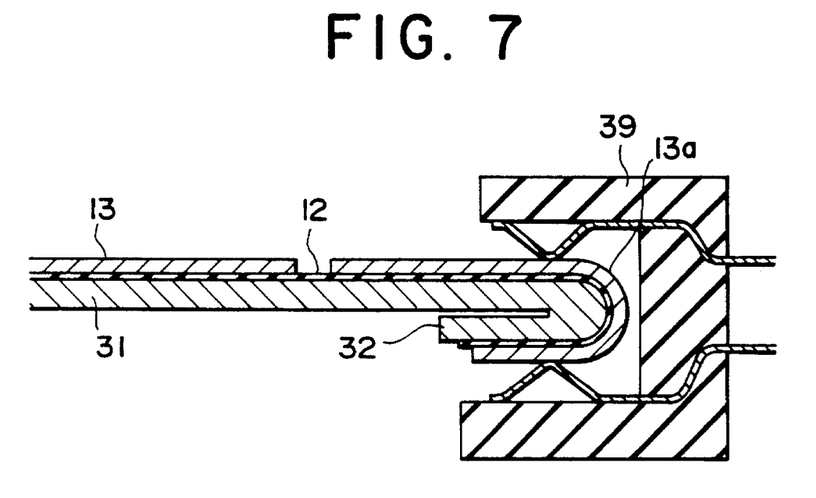
FIG. 7 is a partial cross-sectional view illustrative of a bent section connected with an external connector in the third embodiment.

FIG. 6 is the perspective view showing the structure of a metallic substrate 31 in the third embodiment. FIG. 7 is the partial cross-sectional view taken along line VII—VII. The description of the basic structure of the third embodiment will be omitted because it is identical to that of the second embodiment shown in FIG. 5. As illustrated, the third embodiment has a bent section 32 which is formed by bending about 180 degrees downward the end of the bottom surface section 21c of the metallic substrate 31, which end does not have the flat section 21a. As shown in FIG. 7, the bent section 32 is formed by bending 180 degrees one end of the metallic substrate 31 together with the wiring pattern 13 and the insulating resin layer 12 provided on the metallic substrate 31. The end of the wiring pattern 13 is provided with the input/output terminal 13a of the MOSFET 23 (see FIG. 5) as in the embodiments described above; therefore, as illustrated in FIG. 7, simply by inserting the bent section 32 into a known appropriate female connector 39 which is provided externally, the input/output terminal 13a can be easily connected electrically to the external female connector 39.

In the known power module device shown in FIG. 11, the aforesaid box-shaped cover 108, which protects the lead wire 9 (see FIG. 11), must be provided on the metallic substrate 1 to form the male connector. In this third embodiment, however, since the bent section 32 of the metallic substrate 31 serves as the male connector, it is no longer necessary to provide a separate male connector on the metallic substrate 31. This makes it possible to further reduce the size of the metallic substrate 31 and simplify the assembly process with consequent lower cost.

The third embodiment describes the example which is applied to the same basic structure as that of the second embodiment; it is not, however, limited thereto. The same can be applied also to the metallic substrate 11 of the first embodiment shown in FIG. 2. In this case, the same advantages can be obtained by forming the bent section 32 (see FIG. 7) by bending 180 degrees the end of the flat section 11a of the metallic substrate 11.

The third embodiment also provides the same advantages obtained in the first and second embodiments. In addition, since the metallic substrate 31 of the third embodiment is equipped with the bent section 32 serving as the male connector, no separate male connector is required as stated above, thus achieving a power module device which features a simplified assembly process and reduced cost.

Fourth Embodiment

Figure 8:
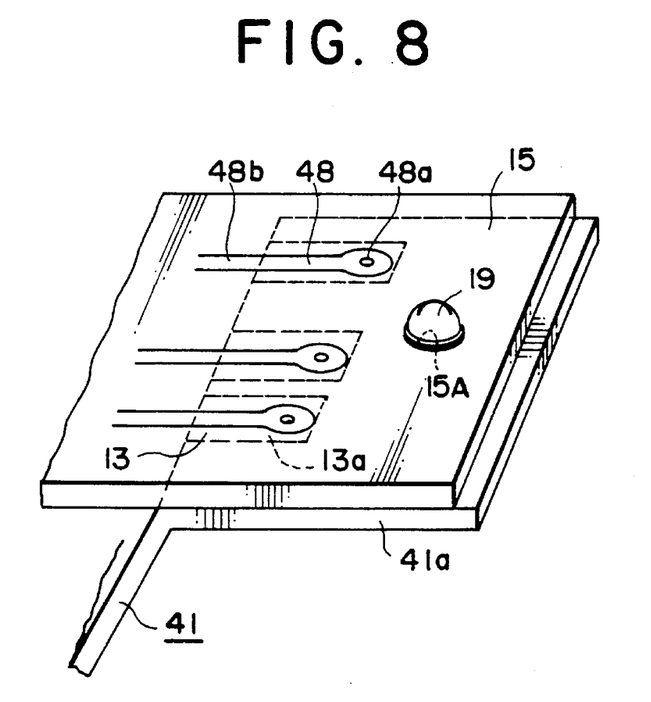
FIG. 8 is a partial perspective view illustrative of the junction or connecting portion between the circuit board and the metallic substrate according to a fourth embodiment of the present invention.

FIG. 8 is the perspective view of a metallic substrate 41 which has been connected to the circuit board 15 (see FIG. 1) in the fourth embodiment. This embodiment can be applied to any of the above first to third embodiments. The description of the part of the structure of the fourth embodiment will be omitted because it will be the same as any of the aforesaid embodiments. The connection between the metallic substrate 41 and the circuit board 15 in the fourth embodiment shown in FIG. 8 will be described.

The metallic substrate 41 is provided with the similar flat section 41a to that in any of the first to third embodiments. The circuit board 15 is rested over the flat section 41a as illustrated. In this embodiment, the circuit board 15 is equipped with a through-hole electrode 48 which has a through hole 48a, the through-hole electrode 48 being installed so that it matches the wiring pattern 13 and the input/output terminal 13a at the end thereof provided on the metallic substrate 41. The inner wall of the through hole 48a of the through-hole electrode 48 is provided with a conductor by plating or the like and the through-hole electrode 48 is electrically connected to the input/output terminal 13a and the wiring pattern 13 with solder (not shown) or the like which is supplied in the through hole 48a. An electrode main body 48b of the through-hole electrode 48 may be provided on the top surface of the circuit board 15 as shown in FIG. 8 or it may be provided to the bottom surface of the circuit board 15 as in the case of the first embodiment.

Figure 9:
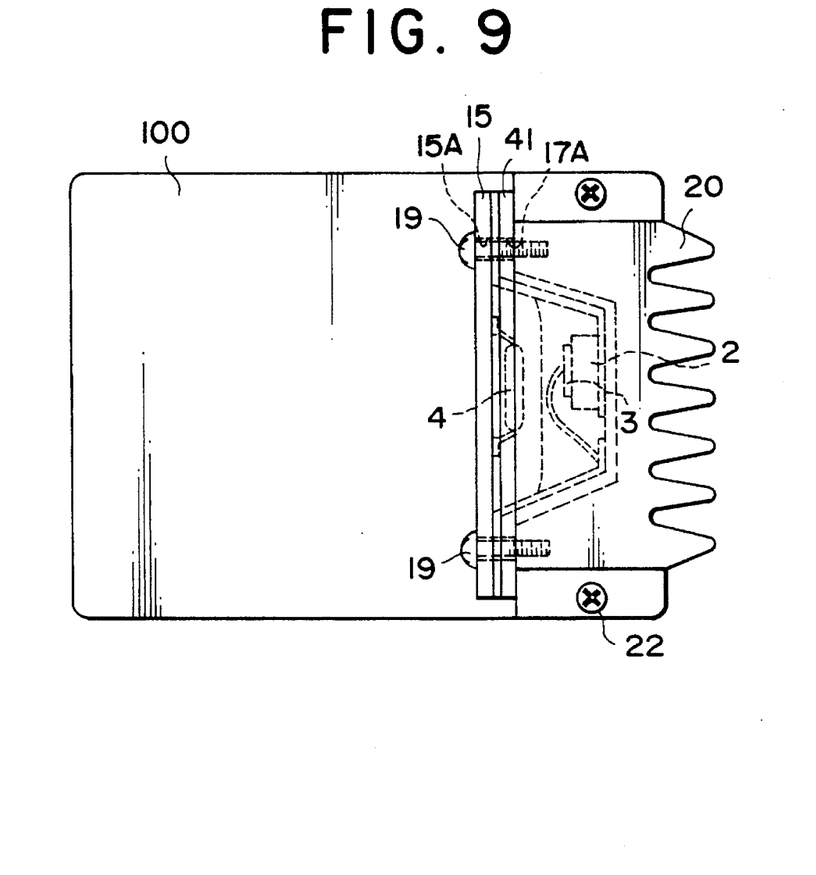
FIG. 9 is a front view illustrative of an example of the power module device of the fourth embodiment which has been mounted.

According to the fourth embodiment, the power module device is composed by providing tapped holes 15A and 17A (see FIG. 9) in both the circuit board 15 and the flat section 41a of the metallic substrate 41, then mechanically fixing and connecting the circuit board 15 and the metallic substrate 41 by screws 19. To mount the power module device on the radiator 20 or the like as shown in FIG. 9, the circuit board 15 and the metallic substrate 41 are fixed on the radiator 20 or the like by using the common screws 19 to install the power module device. According to the fourth embodiment, the screws 19 are used to connect the circuit board 15 and the metallic substrate 41, enabling firm connection and fixation.

Figure 10:
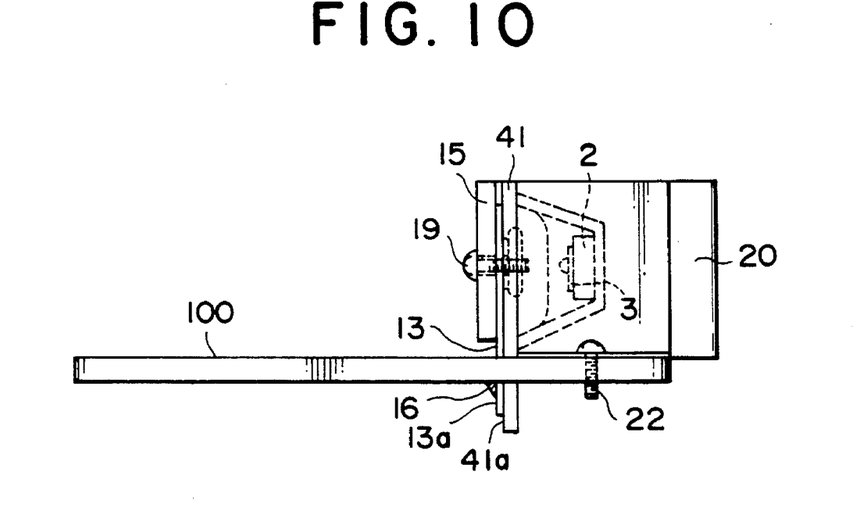
FIG. 10 is a side view of FIG. 9.

In this embodiment, as in the case of the first embodiment, a printed circuit board 100 may be prepared, if necessary, as shown in FIG. 9 and FIG. 10 and the radiator 20 with the power module device mounted on is fixed onto the printed circuit board 100 with screws 22. To fix the radiator 20 on the printed circuit board 100, as shown in FIG. 10, one of the flat sections 41a of the metallic substrate 41 may be let pass through the printed circuit board 100 and the circuit (not shown) provided on the printed circuit board 100 and the input/output terminal 13a on the flat section 41a may be electrically and mechanically connected and fixed with the solder 16 or the like.

The fourth embodiment provides the same advantages as those of the first to third embodiments and it also permits reinforced connection between the metallic substrate 41 and the circuit board 15.

Thus, in a preferred embodiment of the present invention, the size of the metallic substrate can be reduced with a consequent reduced size of the entire power module device since the power element is mounted in the recessed portion provided in the metallic substrate and the circuit board with the control element mounted on the bottom surface thereof is placed over the recessed portion. Further, since the power element and the control element are mounted in the recessed portion provided in the metallic substrate, they can be protected against mechanical damage without the need for providing a special armor. Moreover, the wiring conductor provided on the metallic substrate and the circuit board can be mechanically and electrically connected when placing the circuit board over the recessed portion, thus permitting easier connection between the metallic substrate and the circuit board. Further, it is possible to prevent the heat produced by the power element from being transmitted to the control element, thus preventing the malfunctioning of the power element due to the heat. Still further, the size of the metallic substrate, which is relatively expensive, can be reduced since the lead wire and the armor shown in the known device are no longer necessary, thus enabling the achievement of lower cost. Furthermore, since the power element and the control element are mounted on separate boards, they can be subjected to reliability testing separately.

In another preferred form of the invention, since the side wall section of the recessed portion is provided continuously, it is possible to securely protect the mounted components including the power element and control element and the wiring conductor, etc. from mechanical damage. Further, as necessary, the side wall section, which is continuously provided, allows resin for protecting the power element from humidity to be charged easily in the recessed portion without causing the resin to spread.

In a further preferred form of the invention, the size of the metallic substrate can be further reduced since the recessed portion has only one pair of opposing side walls.

In a still further preferred form of the invention, since the metallic substrate is equipped with a bent portion which serves as a connector, there is no longer the need for providing a separate connector on the metallic substrate, thus permitting a further reduced size of the substrate, a simplified assembly, and reduced cost.

What is claimed is:

1. A power module device comprising:

a metallic substrate having a recessed portion for mounting a power element therein and a flat portion which extends outward from the recessed portion;

a circuit board fixed onto said metallic substrate in such a manner that it covers said recessed portion and having a control element mounted on a surface facing against the bottom surface of said recessed portion; and an electrical connection means for electrically connecting between said power element and said control element and providing the electrical connection with an outside system;

wherein said metallic substrate and said circuit board constitute a package.

2. The power module device according to claim 1, further comprising a bent portion having an input/output terminal so as to function as a connector and provided on said flat portion of said metallic substrate.

3. The power module device according to claim 1, wherein said recessed portion of said metallic substrate has a bottom surface section comprising said bottom surface thereof and a side wall section which extends upward from the circumference of said bottom surface section continuously.

4. The power module device according to claim 3, further comprising a bent portion having an input/output terminal so as to function as a connector and provided on said flat portion of said metallic substrate.

5. The power module device according to claim 1, wherein said recessed portion of said metallic substrate has a bottom surface section and a pair of opposing side walls which extend upward from the opposing sides of said bottom surface section.

6. The power module device according to claim 5, further comprising a bent portion having an input/output terminal so as to function as a connector and provided on a side of said bottom surface section of said recessed portion on which said side walls are provided.

* * * * *